US010461760B2

(12) United States Patent
Gobet et al.

(10) Patent No.: US 10,461,760 B2
(45) Date of Patent: Oct. 29, 2019

(54) ALKALI VAPOR CELL

(71) Applicant: CSEM Centre Suisse d'Electronique et de Microtechnique SA—Recherche et Développement, Neuchâtel (CH)

(72) Inventors: Jean Gobet, Corcelles (CH); Thomas Overstolz, Saint-Blaise (CH); Fabien Droz-dit-Busset, Thielle (CH)

(73) Assignee: CSEM CENTRE SUISSE D'ELECTRONIQUE ET DE MICROTECHNIQUE SA—RECHERCHE ET DÉVELOPPEMENT, Neuchâtel (CH)

( * ) Notice: Subject to any disclaimer, the term of this patent is extended or adjusted under 35 U.S.C. 154(b) by 65 days.

(21) Appl. No.: 15/591,763

(22) Filed: May 10, 2017

(65) Prior Publication Data

US 2017/0331485 A1    Nov. 16, 2017

(30) Foreign Application Priority Data

May 11, 2016    (EP) ..................................... 16169230

(51) Int. Cl.
| | |
|---|---|
| *H03L 7/26* | (2006.01) |
| *G06F 5/14* | (2006.01) |
| *G01R 33/26* | (2006.01) |
| *G04F 5/14* | (2006.01) |

(52) U.S. Cl.
CPC ................ *H03L 7/26* (2013.01); *G01R 33/26* (2013.01); *G04F 5/14* (2013.01); *G04F 5/145* (2013.01)

(58) Field of Classification Search
CPC ........... G01R 33/26; G04F 5/14; G04F 5/145; H03B 17/00; H03L 7/26

USPC ..................................................... 331/3, 94.1
See application file for complete search history.

(56) References Cited

U.S. PATENT DOCUMENTS

| | | | | |
|---|---|---|---|---|
| 10,145,909 | B2* | 12/2018 | Fujii | F17C 3/00 |
| 2005/0046851 | A1* | 3/2005 | Riley, Jr. | G01N 21/031 |
| | | | | 356/437 |
| 2010/0026394 | A1* | 2/2010 | Davis | G04F 5/14 |
| | | | | 331/3 |
| 2012/0206135 | A1* | 8/2012 | Nagasaka | G01R 33/26 |
| | | | | 324/244.1 |
| 2013/0015920 | A1* | 1/2013 | Sato | G04F 5/14 |
| | | | | 331/94.1 |
| 2014/0139294 | A1* | 5/2014 | Harasaka | H03L 7/26 |
| | | | | 331/1 R |
| 2014/0306700 | A1* | 10/2014 | Kamada | G01R 33/26 |
| | | | | 324/244.1 |

(Continued)

*Primary Examiner* — Levi Gannon
(74) *Attorney, Agent, or Firm* — Browdy and Neimark, PLLC

(57) ABSTRACT

In the present invention an alkali vapor cell is proposed comprising a sealed chamber enclosing an alkali atomic gas therein and having at least one optically transparent window. The chamber and the transparent window define an optical beam path through which a light beam can pass and which interacts with the alkali atomic gas in the chamber. The alkali vapor cell comprises at least one localized condensation area of alkali atoms at a predetermined location in the sealed chamber and the predetermined location is located inside or outside the optical beam path. The localized condensation area has higher alkali metal wettability than any other surface portion of the alkali vapor cell outside said localized condensation area.

19 Claims, 2 Drawing Sheets

(56) References Cited

U.S. PATENT DOCUMENTS

| | | | |
|---|---|---|---|
| 2015/0084707 A1* | 3/2015 | Maki | H03L 7/26 331/94.1 |
| 2015/0244382 A1 | 8/2015 | Ishihara | |
| 2015/0270843 A1 | 9/2015 | Nakajima et al. | |
| 2015/0349791 A1* | 12/2015 | Nakajima | H03L 7/26 331/94.1 |
| 2015/0372686 A1 | 12/2015 | Parsa | |
| 2016/0126965 A1* | 5/2016 | Hashi | G04F 5/145 331/94.1 |

* cited by examiner

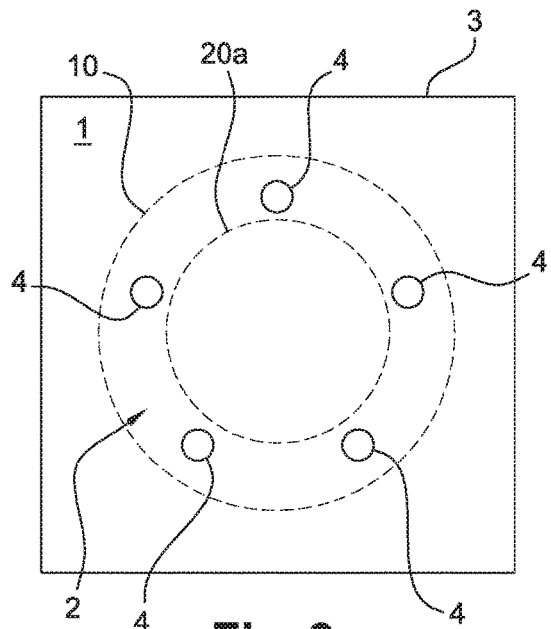
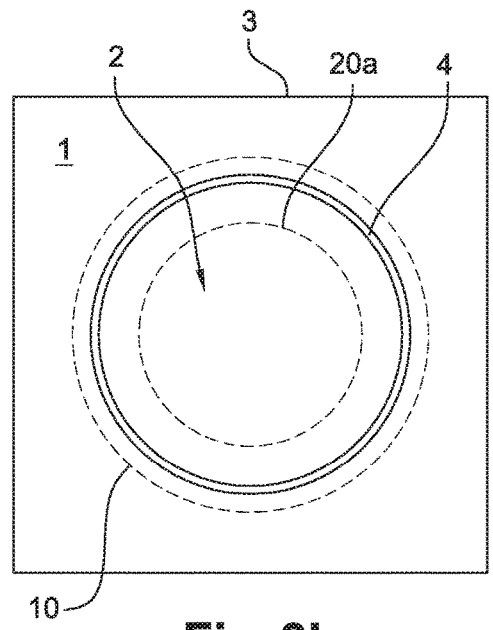
Fig. 3a  Fig. 3b
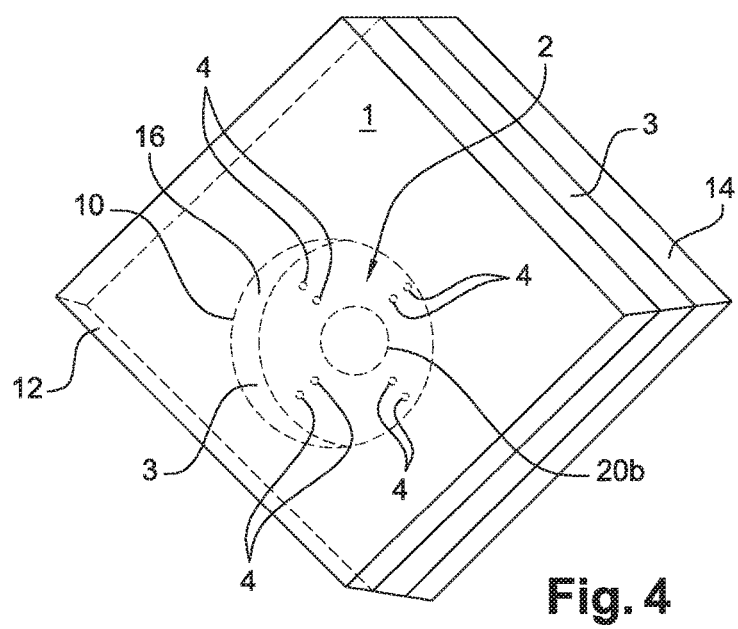
Fig. 4

ALKALI VAPOR CELL

TECHNICAL FIELD

The present invention relates to the field of frequency reference and spectroscopic devices. More particularly, the present invention relates to alkali vapor cells of miniaturized atomic clocks having a reduced size and that may be integrated in portable systems.

BACKGROUND OF THE INVENTION

Atomic clocks have been developed since more than 50 years, following fundamental scientific progress and developments in the field of quantum mechanics and microwave spectroscopy. Atomic clocks are based on microwave emission as a result of electronic transitions between the electronic energy levels of atoms. In practice alkali metals, in particular rubidium (Rb) and cesium (Cs), are the preferred choice for the interrogation due to their relative simple electron configuration and their high vapor pressure at relatively low temperatures. On the other hand a major challenge is related to the high reactivity of these alkali metals with oxygen and water. For this purpose the alkali metal is normally confined under a well-controlled atmosphere is a small cavity, called a vapor cell.

Vapor cell technology and control systems have made huge progress in the field of atomic clocks. It that field, the main aim is to improve the degree of accuracy and also the stability of the frequency signals delivered by the atomic clocks.

In 2004 the National Institute of Standards and Technology (NIST) presented the first chip-scale atomic clock: S. Knappe et al., "A Micro fabricated atomic clock", Appl. Phys. Lett. 85, p. 1460, 2004. This chip-scale atomic clock had a volume of less than 10 mm$^3$ and a power dissipation of 125 mW. This achievement led to the possibility to develop atomic clocks for portable and battery-driven devices. Since then chip-scale atomic clocks have gained a worldwide interest for a wide range of industrial applications.

Since the availability of MEMS fabrication techniques, chip-scale atomic clocks have been developed comprising vapor cells having internal gas volumes in the range of 1-10 mm$^3$. Advantage of MEMS fabrication techniques is that thanks to the small size of the vapor cells hundreds or even thousands of vapor cells can be fabricated at once on a single silicon wafer, which cuts drastically the fabrication costs.

One of the issues arising from such very small volume vapor cells is that the size of a cross-section of the cavity in a plane perpendicular to the optical beam is close to the diameter of the optical beam itself, usually a laser beam, used to interrogate optically the alkali vapor cell by spectral absorption. Hence metallic alkali which is not in vapor phase may aggregate on a surface of the cavity in the optical path of the optical beam causing a well-known light-shift of the atomic frequency due to variation of light intensity induced by the presence of non-gaseous alkali metal which is typically in the form of alkali metal liquid droplets. The presence of non-transparent material within the light path decreases the transmission of the light through the cell by scattering or absorption. While this phenomenon is generally unwanted, a much more critical problem arises if the size, the shape or the location of the non-transparent areas within the light path is modified during the operation of the cell. Such uncontrolled variations lead to light shift effect.

The problem of the interference of metallic alkali, for example rubidium, within the optical path of an alkali vapor cell is well known and it is necessary to avoid and prevent it as much as possible. In traditional larger bulk cells this can be realized by localizing the alkali metal in a convenient location, for example by creating a cold area in a heated vapor cell. This approach is well known and is described for example in: McGuyer et al. "Atomic physics with Vapor-Cell Clocks", p. 153, Dissertation, Princeton University, June 2012. Herein is described for example that the excess of alkali metal in the vapor cell required to produce a vapor introduces scattering and absorption, and also that these effects can be reduced by confining this excess in a more desirable portion in the cell through selective heating and cooling.

In a miniaturized vapor cell of a few cubic millimeters or smaller, precise localization of the metallic alkali outside the optical beam path is not easily realized in this way. Creating a thermal gradient allowing a well-defined localization within distances of 100 micrometers implies a complex set-up and a slow process which is not easily achievable at a wafer scale level and it will increase fabrication costs considerably.

Furthermore, during storage, when the cell temperature experiences an uncontrolled temperature gradient, the alkali metal can migrate to an unwanted location by the same mechanism. With larger volume clock systems, without stringent power consumption limitations, one could imagine to create a temperature gradient including a colder spot within the vapor cell, this ensuring the relocation of the alkali metal. Energy consumption is of paramount importance in miniaturized cells designed for portable applications. The thermal insulation of the heated vapor cell must be nearly perfect and any cold spot would be the source of an inacceptable power loss. Thus, a problem caused by a thermal gradient during storage might result in a permanently dysfunctional device.

Miniaturized cells comprising two reservoirs have also been reported in the past. In this approach the alkali metal is placed in a first chamber connected by a narrow opening to a second chamber where metallic vapor is diffused to as described in US 2011187464 (A1) and also in: R. Straessle et al. "Microfabricated alkali vapor cell with anti-relaxation wall coating", Applied Physics Letters, vol. 105, nr.4, p. 043502, July 2014.

SUMMARY OF THE INVENTION

An object of the present invention is to propose a new alkali vapor cell to overcome at least partially the limitations of alkali vapor cells of prior art.

This is achieved by an alkali vapor cell comprising a sealed chamber enclosing an alkali atomic gas therein and having at least one optically transparent window. The chamber and the transparent window define an optical beam path through which a light beam can pass to interact with the alkali atomic gas in the chamber. The alkali vapor cell comprises at least one localized condensation area of alkali atoms at a predetermined location in the sealed chamber. The localized condensation area comprises a metal layer.

In an embodiment, the localized condensation area has higher alkali metal wettability than any other surface portion of the vapor cell outside said localized condensation area.

Said predetermined location is preferably situated outside said optical beam path.

In an embodiment said predetermined location is located inside said optical beam path.

In another preferred embodiment said chamber comprises a second window.

In an embodiment the localized condensation area is arranged on at least one of the internal surfaces of the chamber.

In an embodiment the localized condensation area comprises a ring shaped metal layer disposed on at least one internal surface of the chamber.

In an embodiment the alkali vapor cell comprises several localized condensation areas comprising a plurality of thin metal layers arranged on at least one of the internal surfaces of the chamber.

In an embodiment the metal of said metal layer is chosen among copper, tantalum, gold, platinum, nickel or a combination thereof.

Another object of the present invention relates to an atomic clock comprising the alkali vapor cell of the invention.

A further object of the invention relates to a method to locally condense or aggregate alkali atoms in an alkali vapor cell, said method comprising the steps of:
  forming a chamber of an alkali vapor cell;
  providing an alkali metal compound in said chamber;
  sealing said chamber with the alkali metal compound therein with a transparent window;
  The chamber and the window define an optical beam path through which a light beam can pass.

The method further comprises the step of defining at least one localized condensation area on at least one of the internal surfaces of said chamber in at least one predetermined location prior to filling and sealing said chamber.

The step of defining at least one localized condensation area comprises locally depositing a metal layer on said predetermined location.

In an embodiment of the method, the step of providing the chamber with an alkali metal compound comprises introducing an alkali metal in said chamber.

In an embodiment of the method, the step of providing the chamber with an alkali metal compound comprises filling the chamber with an alkali metal compound and producing an alkali metal therefrom.

In an embodiment of the method, the metal of said metal layer is chosen among copper, tantalum, gold platinum, nickel or a combination thereof.

In an embodiment of the method said predetermined location is located outside said optical beam path.

In an embodiment of the method said predetermined location is located inside said optical beam path.

BRIEF DESCRIPTION OF THE DRAWINGS

FIG. 3a shows localized condensation areas on a surface of an alkali vapor cell, arranged outside an optical beam path in that cell;

FIG. 3b show a ring-shaped localized condensation area on a surface of an alkali vapor cell, arranged outside an optical beam path in that cell;

FIG. 4 shows alkali metal drops condensed on 8 localized condensation areas outside an optical beam path in that cell;

DETAILED DESCRIPTION

Figure 1:
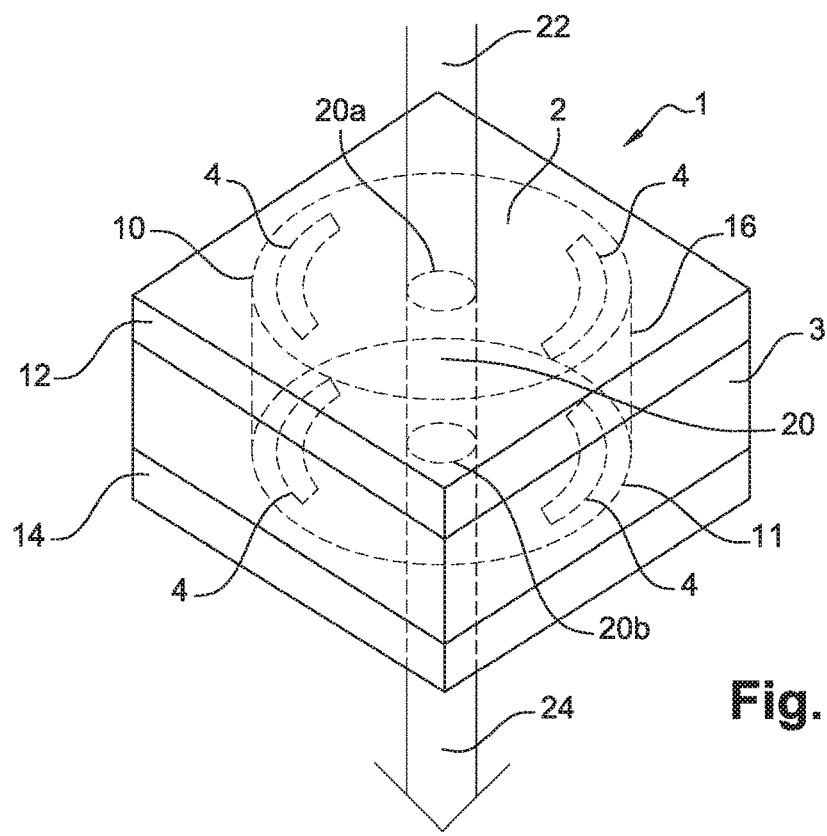
FIG. 1 illustrates an alkali vapor cell comprising a first window and a second window.

The invention concerns an alkali vapor cell 1 comprising at least one, preferably several specific predetermined areas having a high affinity to alkali metals, in particular rubidium and cesium, so that alkali metal is preferentially condensed or aggregated on these areas. The predetermined areas in the vapor cell 1 are preferably located outside an optical beam path 20 defined in a chamber 2, also defined as principal chamber, of the alkali vapor cell 1 and through which an optical beam passes when the vapor cell 1 is in operation. The optical beam, of which the intensity is at least a fraction of an incident light beam 22, interacts with alkali gas in said chamber 2 when a device, for instance an atomic cell or clock or spectroscopic devices, incorporating the alkali vapor cell is in operation.

As further explained, the predetermined area(s), also defined as localized condensation area(s) 4, are specific surfaces with high affinity towards alkali metals such as a metal or metallic alloy coatings, e.g. gold, to create preferential vapor condensation locations in the alkali vapor cell 1.

Preferably, the alkali vapor cell 1 is adapted to be integrated in a miniaturized atomic clock, preferably realized by MEMS (acronym for micro electromechanical systems) fabrication methods.

As explained in further details hereinafter, a localized condensation area 4 with high affinity towards alkali metals is arranged in at least one location within the alkali vapor cell 1 so as to minimize the interference with the measuring light, i.e. said optical beam transmitted through the chamber of the alkali vapor cell 1.

The localized condensation areas 4 with high affinity towards alkali metals prevent any migration of liquid metal within the cell during operation. The localized condensation areas 4 are preferably outside the optical beam in operation of the vapor cell. Even if the localized condensation areas are within the optical beam the liquid metal droplets are immobilized at these predetermined localized condensation areas. This avoids instabilities of the optical signal which may be induced by the migration of liquid metal droplets in the optical light beam.

Other devices intended for other applications, such as magnetometers and other spectrometric devices, which comprise the alkali vapor cell 1 of the invention may also benefit from localization of condensed alkali metal preferably outside the optical beam path 20 in the measurement chamber 2 of these devices. It is understood here that said alkali metal may be in the form of droplets and may have any three dimensional shape. The term droplets is to be understood in a general way, it may be droplets of liquid metal but also thin layers of liquid metal that may have any shape or any dimension. The droplets have typical cross sectional dimensions between 5 μm and 200 μm.

More precisely, the localized condensation areas 4 are preferably at predetermined locations outside the optical beam path 20 defined in the vapor cell 1 as described further, and have higher alkali metal wettability than any other internal surface portion of the vapor cell 1 outside said localized condensation areas 4.

It is understood that the localized condensation areas 4 may be located at any surface inside the chamber 2 of the alkali vapor cell 1. For example, this surface may be the surface of the first window 12 to the side of the chamber 2, or may be a part of the internal wall 16, or may be a surface of an additional chamber which is in gaseous connection with the principal chamber 2 of the alkali vapor cell 1 in which the optical beam path 20 is defined.

For example a first localized condensation area 4 may be arranged at the first window 12 to the side of the chamber and a second localized condensation area 4 may be present at a wall of the chamber. In a variant at least two localized condensation areas may be connected by at least another localized condensation area. For example two ring-shaped localized condensation areas 4 may be connected by a strip-shaped localized condensation area 4.

Figure 2:
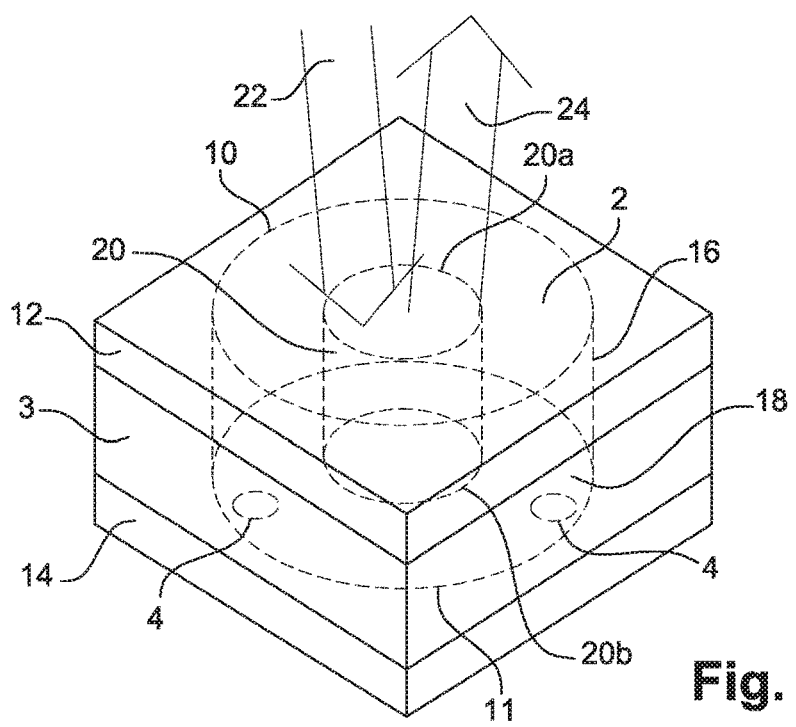
FIG. 2 illustrates an alkali vapor cell comprising a first window and a reflector opposing the first window inside the chamber of the alkali vapor cell.

A typical alkali vapor cell 1, preferably used for a miniaturized atomic clock, is illustrated in FIG. 1 and in FIG. 2. The alkali vapor cell 1 comprises a first window 12 and a second window 14 as illustrated in FIG. 1. The first window 12 is an optical entry window, defining a first aperture 10, and allows transmission to the chamber 2 of the alkali vapor cell 1, in operation, of at least a portion of an incident optical beam 22. The second window 14, defining a second aperture 11, is an optical exit window of the alkali vapor cell 1 for outcoupling an outcoupled optical beam 24 which is at least a portion of the incident optical beam 22. In a variant no second window 14 is integrated in the vapor cell and a reflector 18 opposite said first window 12, may be incorporated in the vapor cell 1 so that said first window 12 acts as an incoupling and an outcoupling window of the cell 1. The reflector 18 may be a reflecting surface or any structure that reflects a portion of the optical beam transmitted in the chamber 2. By designing the alkali vapor cell 1 one identifies an optical beam path 20 in which said optical beam must pass when the device that incorporates the alkali vapor cell 1 is in operation.

It is understood that the optical beam path may intersect several optical surfaces in the chamber 2, such as reflecting, diffracting or refracting optical surfaces. These optical surfaces determine the propagation of the optical beam inside the chamber 2. It is to be specified that alkali metal in vapor state must be present within the optical beam path 20 in order to allow an optical beam, passing into said optical beam path, to interact with the electrons of the alkali metal in vapor state. The transmitted optical beam intensity in the vapor cell is smaller than the intensity of the incident beam 22 because of reflection losses by the first window 12 or the possible presence of an aperture, such as a diaphragm, limiting the cross section of the transmitted optical beam in the vapor cell. The optical beam path 20 defines the path within which any presence or condensation of alkali metals in a non-vapor state should be avoided as much as possible. The optical beam path comprises a first internal area 20a defined at the internal surface of the first window 12 of the vapor cell and defines also a second internal surface 20b defined in an embodiment of a vapor cell comprising a first 12 and a second window 14. In such a case said second internal area is defined at the internal surface of said second window. Preferably no alkali metal droplets should be present in any cross section of the optical beam in the vapor cell 1.

In a particular case, in operation of the alkali vapor cell 1, the optical beam that is transmitted through said principal chamber 2 may be arranged to fit exactly in the defined optical beam path 20. This is the case for example in the arrangement illustrated in FIG. 1.

In general, the transmitted optical beam in the chamber 2 has a smaller cross section, defined perpendicular to its optical axis, than said optical beam path 20 and this for any cross section of the propagated optical beam inside the chamber 2. The reason why the optical beam path 20 should preferably have a greater cross section than the optical beam, inside the chamber 2, used during operation of the vapor cell 1 is to provide tolerance for the optical light beam to be transmitted through the cell 2 and assure that said predetermined locations are positioned outside the path of the optical beam. Any cross section of the optical beam path 20, defined perpendicular to its optical axis, is preferably smaller than said first 10 and said second 11 apertures.

In a specific case, said first aperture 10 and said second aperture 11 defines the optical beam path 20 and the portion of the optical beam passing through the cell may have the same shape as said optical beam path. The optical beam path 20 and/or the first aperture 10 and/or the second aperture 11 may have any cross section, such as a square, a rectangular or a circular cross section. Preferably the optical beam path 20 should be defined in the chamber 2 so that no alkali metal particle is present in the optical beam path 20.

Typical surface areas of said first 10 and said second 11 aperture are of about 2-7 mm2. A typical surface area of the cross section of the optical path is of about 2 $mm^2$ and a typical surface area of said optical beam inside the chamber 2 is of about 0.8 $mm^2$. The optical beam transmitted in the chamber 2 may be a collimated beam, or a diverging beam or a converging beam. Preferably, the three-dimensional shape of said optical path is a cylindrical shape but it may be any shape, for example a conical shape or any shape having for example a cross section that has a rectangular beam shape. The shape of the cross sections of the optical beam path 20 and the optical beam may vary along their length. The shape of the optical beam and the shape of said optical beam path 20 may be different shapes, but the optical beam always has to fit within the volume of the 3-D shape defined by said optical path 20. Preferably, but not necessarily so, said localized condensation areas 4 are defined outside the volume defined in said chamber 2 by said optical beam path 20. By defining the localized condensation areas 4 outside the optical beam path 20 one avoids optical effects that may be induced by the change of shapes of the alkali metal droplets when present in the optical path. In some vapor cell geometries it is not possible to have the localized condensation areas outside said optical beam path which requires in that case localized condensation areas 4 having a geometry such that the condensed alkali metal droplets are in the form of a thin film so as to avoid any influence on the intensity of the optical beam as further described.

The chamber 2 of the vapor cell 1 is a cavity, preferably realized in a substrate 3 arranged to contain an alkali metal compound and an alkali gas such as Cesium or Rubidium. Other alkali gases are possible as well. The alkali gas of the vapor cell 1 is typically produced by irradiating with UV light an alkali salt incorporated in the vapor cell 2 before its sealing, but other methods to provide the alkali gas in the chamber may be used as well. Preferably, the vapor cell 1 is made by MEMS techniques. Methods to realize a vapor cell 1 using MEMS technologies, especially those based on Si etching technologies, are well known and will not be described further. One may refer for example to the following publications incorporated here in their entirety:

M. H. Kwakernaak, "Components for batch-fabricated chip-scale atomic clocks", 36th annual Prices Time and Time Interval (PTTI) Meeting, p. 355-368, 2004.

S. Knappe et al. "Atomic vapor cells for miniature frequency references", proceedings of the 2003 IEEE International Frequency Control Symposium, p. 31-32, 2003

V. Venkatraman et al., "Micro fabricated Chips-scale Rubidium Plasma Light Source for Miniature Atomic Clocks", IEEE transactions on Ultrasonics, ferroelectrics and Frequency control 59, 3, p. 448-456, 2012

M. Pellaton et al. "Study of laser-pumped double resonance clock signals using a micro fabricated cell", Physica Scripta, T149, 014013, 2012

Y. Pétremand et al., "Micro fabricated rubidium vapor cell with a thick glass core for small-scale atomic clock applications", J. Micromech. Microeng., 22, 2, p. 025013, 2012.

In a variant, the vapor cell 1 may comprise at least one opening realized in a side wall 16 of the vapor cell 1, arranged to introduce the alkali gas provided by a second gas chamber linked to said vapor cell 1. Such a vapor cell 1 is for example described in the document US 2015/0270844 A1, which is incorporated here in its entirety. The alkali vapor cell 1 may be realized in different ways, for example in glass by using techniques such as glass blowing techniques.

The chamber 2 of the alkali vapor cell 1 has a volume preferably smaller than 10 mm³, more preferably smaller than 5 mm³. The same invention may be applied to alkali vapor cells having shapes which may have square, round or rectangular cross section shapes.

In a preferred embodiment, a local coating having a high wettability for alkali metals is arranged on one or both of the surfaces of the transparent windows 12, 14 inside the chamber 2 of the alkali vapor cell 1, and outside or inside the intersection of the predetermined optical beam path 20 with the first 12 and second 14 window.

The local coating is preferably a thin film of a suitable material, such as a metal, having a high surface energy and having little tendency to form an oxide passivation layer. The formation of intermetallic compounds between the thin film material and the alkali metal or the dissolution of the thin film material into the liquid alkali metal is not necessarily detrimental and may even increase the affinity toward the alkali metal. The shape, the surface area and the localization of the thin film metallization are chosen to achieve a subsequent stable condensation of the alkali metal at predetermined condensation locations or areas 4 preferably outside the optical beam path of the vapor cell 1 in order to minimize the interference with the measuring light.

A low wetting angle between a liquid and a surface is a good indication of a high affinity between the liquid and the material surface. The principles and physics of governing and defining affinity of a liquid and the wetting angle are well known and will not be further described here. Therefore reference is made to the following publications, incorporated here in their entirety by reference:

G. Bracco, B. Hoist (eds.), «Contact Angle and Wetting Properties», Chapter 1, Surface Science Techniques, Vol. 51 of Springer Series in Surface Science, 2013, pp. 3-34

F. Delannay, L. Froyen, and A. Deruyttere, "The wetting of solids by molten metals and its relation to the preparation of metal-matrix composites," Journal of materials science, vol. 22, no. 1, pp. 1-16, 1987.

It is essential in the invention that the affinity of the molten alkali metal for the surfaces where alkali metal droplets must be avoided such as part of the transparent windows 20a and 20b, where the optical beam passes, should be lower than the affinity for the locally applied coating. It was observed by the inventors that Rubidium vapor condensation on the internal side of the glass (for example Borofloat glass) window 12, 14 used to seal rubidium into an alkali vapor cell 1 produces small droplets scattered over the surface, with a contact angle close to 90°, therefore indicating a weak affinity between the two materials.

It is well known that the vapor pressure of a liquid is dependent on the temperature and also on its radius of curvature as described by the Kelvin equation $$\ln = \frac{p}{p_0} = \frac{2\gamma V_m}{rRT}$$

wherein p is the actual vapor pressure, $p_0$ is the saturated vapor pressure, $\gamma$ is the surface tension, $V_m$ is the molar volume of the liquid, R is the universal gas constant, r is the radius of the droplet, and T is temperature.

It follows that the vapor pressure of droplets with a large radius of curvature will be lower than the vapor pressure of droplets with a small radius of curvature. Providing that the total localized condensation surface area is large enough, the radius of curvature of the liquid alkali metal spread as a thin film over the high affinity locations will be larger than the droplets formed over poorly wetted areas. In a homogeneous temperature environment, above the melting point of the alkali metal (e.g. 28.4° C. in the case of Cs, 39.5° C. in the case of Rb) the metal migrates from a low affinity surface to a high affinity surface in a manner equivalent to the one realized by a temperature gradient.

It has to be referred here to the law of Raoult. This law states that the vapor pressure of each component of an ideal mixture of liquids is equal to the vapor pressure of the pure component multiplied by its mole fraction in the mixture. If the coating or a portion of the coating having a high affinity towards the alkali metal dissolves in the liquid alkali metal, according to the law of Raoult, the vapor pressure of the alkali metal will be decreased in proportion to the decrease of its atomic concentration in the melt. Likewise this phenomenon will produce a migration of the liquid metal towards the high affinity surface by gaseous diffusion. This is in particular the case with the preferred gold coating. Depending on the temperature, several atomic percent of gold will be dissolved in the liquid alkali metal as indicated by the relevant phase diagrams.

The alkali vapor cell 1 of the invention allows a precise control of the condensation or aggregation of alkali metal. The provision of localized condensation areas 4 as proposed by the invention is simple and cheap to implement, even in classical alkali vapor cells produced by traditional glass blowing techniques, and has great benefits to the stability and precision of the devices incorporating the alkali vapor cell 1.

Furthermore it has been observed in known alkali vapor cells of atomic clocks that small metallic droplets scattered over the transparent window surfaces alter their locations as well as their shapes and sizes during the lifetime of said vapor cell. When droplets are present in the optical beam path these droplet modifications produce small variations of laser intensities that influence the clock frequency stability. This perturbing phenomenon is prevented with the alkali vapor cell 1 of the invention even if the localized condensation areas are placed within the optical beam path because the shape and size of the alkali metal condensates are defined by the shape and size of the predetermined condensation areas 4 having high alkali metal affinity.

The proposed solution is simpler and more cost effective than placing the alkali metal in an additional chamber distinct from the measurement, i.e. principal, chamber. Even by placing the alkali metal in an additional chamber, metal drops may form, during operation of the cell, on portions of the surfaces in the chamber intersecting with the optical beam.

The alkali vapor cell of the invention is particularly well adapted to miniaturized atomic clock cells. There is large degree of freedom in the design of the shape and size of the predetermined condensation areas 4.

The risk of an accidental displacement of the alkali metal resulting from a temperature gradient within the cell 1 during storage is further limited by the lower vapor pressure resulting from the large radius of curvature of the localized alkali metal, or the lower vapor pressure resulting from the dissolved thin film high affinity metal in the alkali metal. In the case that such a displacement has taken place due to an excessive temperature gradient, when the alkali vapor cell 1 comprising predetermined condensation areas with high affinity is placed again in its normal homogenous temperature working environment, the alkali metal will again, in operation of the alkali vapor cell, preferentially condense on said areas 4 with high affinity.

FIGS. 3a and 3b show two examples of a possible layout of predetermined condensation areas 4 having high affinity to alkali metal on a transparent window 12. While a preferred implementation is realized by local coating of at least one of the transparent covers 12, 14 it is understood that other areas of the alkali vapor cell 1, in particular the wall 16 of the cavity 2 can also be totally or partially coated (or made of) by a material having high affinity toward molten alkali metals to achieve the same objective of the invention.

FIG. 3a shows an example of a possible arrangement of the predetermined condensation areas 4 on the inside surface of a first window 12 of an alkali vapor cell. FIG. 3b shows a ring shaped area 4 having a high alkali metal affinity. In FIG. 3a and FIG. 3b the dashed line shows the first aperture 10 of the chamber 2. The location of the predetermined condensation areas 4 having high alkali metal affinity may be arranged on the inside surface of the first 12 and/or second window 14, or may be arranged on any other inside surface of the chamber such as on a part of the internal wall 16, or on a surface of a secondary chamber connected to the principal chamber 2.

The predetermined condensation areas 4 are preferably made of a gold coating. Other metals such as tantalum, copper, platinum, nickel are also known to have a high affinity towards alkali metals. Other examples of metals are thallium, tin, lead. Non-metallic material with a high affinity to molten alkali metals, such as for example diamond or diamond like carbon can also be used. In a variant, a combination of high alkali metal affinity materials may be used. Also, in a variant, nanostructures or microstructures may be used to control the wettability of the surface by the alkali metal and these nano- or microstructures may be combined with a coating of high alkali metal affinity material.

It is also understood that predetermined condensation areas 4 may be defined as any area outside a local area through which the optical beam passes and wherein said local area is an area that has been treated so as to reduce the affinity towards alkali metals. This can be realized by for example a silanization of that local area. For example, the central portion of a window through which an optical beam passes may be treated by a silanization process such that the outside portion of that window has a higher alkali metal affinity than said central portion so that no alkali metal condenses on said central portion. In that sense, in this latter embodiment, the outside portion of the window is defined as a predetermined condensation area 4. In a variant the whole surface of a window inside a vapor cell through which the optical beam passes may be treated so that its affinity toward alkali metals is lower than any other surface inside said vapor cell. In that sense, in this variant, said any other surface is defined as a predetermined condensation area 4.

The high affinity coating can be formed as a multilayer comprising an adhesion layer such as Cr, Ti or other similar metals. Also, a barrier layer, such as TiW, may be incorporated in the high affinity coating to prevent diffusion between the adhesion layer and the high affinity layer or to prevent diffusion of the high affinity layer into the cavity material.

In another configuration the opaque localized condensation areas are placed within the optical beam path. The reduction of optical transmission is entirely defined by the opaque localized condensation areas provided that the projection, normal to the transparent window, of each alkali metal droplet is entirely inside the perimeter of its localized condensation area. In order to fulfill this requirement the alkali metal thickness must be limited. As a rule, the thickness of a uniformly deposited alkali metal layer divided by the smallest lateral dimension of the condensation areas must be smaller than 0.25, preferably below 0.15. Hence the reduction of optical transmission is always constant and thus invariant in time and therefore not a source of light-shift phenomenon, even if some alkali metal is consumed over time.

The thickness of the high affinity material is not relevant for optical intensity effects, except in cases when the material can react with the alkali metal thus decreasing the amount available for atomic gas generation. In such a case the total amount of the high affinity material within the cell must be limited. This is in particular the case with the preferred gold coating. Both cesium and rubidium form low temperature eutectics with gold and both react with gold to form intermetallic compounds, in particular AuRb and AuCs. It is believed that intermetallic formation affects positively the affinity of the alkali metal towards the gold surface during the initial phase of the condensation process. The intermetallic dissolved in the liquid phase can also slightly depress the vapor pressure favoring the local condensation of the alkali metal. The alkali metal vapor pressure of the pure intermetallic compounds is however much lower than the vapor pressure of the pure metals, and is insufficient to produce the desired atomic gas concentration in the vapor cell. The amount of gold within the cell 1 must therefore be sufficiently small to keep the atomic ratio R of Au to Rb or Au to Cs in a range of 0.001 to 0.9 preferably between 0.01 and 0.1. The amount of deposited gold is defined by the total surface area of the metallization and by the gold film thickness, therefore R is defined by $$R = \frac{(S_{AU} \times T_{AU} \times D_{AU})}{M_{AU}} \times \frac{M_{Alkali\ Metal}}{W_{Alkali\ Metal}}$$

where $S_{Au}$, $T_{Au}$, $D_{Au}$, $M_{Au}$ are respectively the total surface of the gold thin film, the thickness of the gold thin film, the density of gold and the atomic mass of gold, $M_{Alkali\ Metal}$ and $W_{Alkali\ Metal}$ are respectively the atomic mass of the alkali metal and the mass of the alkali metal put in the cell.

Standard sputtering or evaporation processes achieve without difficulty reproducible thicknesses of a few nanometer or more. As an example, assuming that a maximum of 10% of 1 μg of metallic Rb is allowed to be reacted with a 50 nm thick gold coating (R≤0.1), the maximum gold surface area is about 240'000 μm2.

The alkali vapor cell 1 of the invention can be formed by a method comprising the following steps:
  forming a chamber 2 of a vapor cell 1;
  filling said chamber 2 with an alkali metal compound;

sealing said chamber 2 with the alkali metal compound therein with a transparent window 12;

producing an alkali metal by decomposing said alkali metal compound for example by UV irradiation or by heating or by any other type of decomposition technique of an alkali metal compound, the chamber 2 and window 12 defining an optical beam path 20 through which a light beam can pass to interact with the alkali gas in the chamber 2.

The method further comprises the step of defining at least one localized condensation area 4 on at least one of the internal surfaces of said chamber 2 prior to filling and sealing said chamber 2. Said at least one predetermined location 4 is preferably, but not necessarily, located outside said optical beam path 20.

In a variant of the method, the step of defining at least one localized condensation area 4 comprises locally depositing a metal layer on an internal surface of said chamber. Said internal surface is preferably, but not necessarily, outside the optical beam path 20.

In an embodiment of the method, the metal of said metal layer is chosen among the metals copper, tantalum, gold platinum, nickel or a combination of them.

The fabrication process steps of the alkali vapor cell 1 are unchanged compared to the one used for a cell not including the invention except for an additional initial metal deposition step and an additional final thermal treatment that induces the condensation of the alkali metal vapors over the high affinity areas 4.

Example of the Method of Fabrication of the Invention.

Miniaturized cells 1 are made by first etching through holes in a silicon wafer. The next step consists of sealing one side of the cavity 2 by attaching to it a second wafer made of a transparent material. Anodic bonding of glass to silicon is a well-known and commonly used technique for this operation while other options as for example metal welding are also known. The alkali metal is thereafter placed in the open miniaturized cavities 2 thus created, either in pure form under a protective atmosphere, or as a precursor compound stable in air. The cavity 2 is then sealed either under vacuum or under a low pressure of a non-reacting gas or gas mixture by attaching a third wafer of transparent material to the other side of the silicon wafer. The individual alkali vapor cells 1 are obtained by dicing the wafer stack. If a precursor is used, the appropriate thermal and/or ultraviolet irradiation treatment transforms the precursor compound, which is stable in a standard air atmosphere, into a highly reactive alkali metal.

A detailed description of one implementation technique is given in US20120301631A1, incorporated here in its entirety by reference.

The invention requires two modifications of the standard fabrication process depicted above.

The first one consists in creating localized predetermined condensation areas 4 having a high affinity to the alkali metal. Local deposition of the suitable layer or layers can be done by well-known physical vapor deposition (evaporation, sputtering), chemical vapor deposition, wet deposition techniques (electroless plating, electroplating, sol-gel) or a combination of these techniques or other suitable techniques. Precise localization of the high affinity areas can be achieved by well-known technique such as shadow masking, lift-off, through mask etching or other techniques (laser ablation etc.).

The second and last step necessary for the method of the invention is a thermal treatment of the completed alkali vapor cell in a uniform temperature oven at a temperature comprised between the melting temperature of the alkali metal and the maximum temperature that does not compromises the alkali vapor cell integrity, preferably between 80° C. and 350° C., more preferably between 100° C. and 200° C., for a time comprised between 1000 h to 1 h, more preferably between 6 h to 120 h. After cooling at room temperature, the alkali metal is displaced over the high affinity areas. The aforementioned problem of the interference of metallic Cs or Rb in the light path can thus be either strongly reduced and kept constant during cell operation or be completely eliminated.

Detailed Implementation Example

Alkali vapor cells 1 according to the invention are fabricated by etching through holes of 2 mm diameter into a 1 mm thick silicon wafer followed by anodic bonding of a first borofloat glass wafer of 0.2 mm thickness onto one side of the silicon wafer. Following this process step, the cavities 2 are filled with 10 nL of aqueous RbN3 solution of 100 g/L concentration using a dispenser from Microdrop Technologies GmbH, type MD-K-130-030. The details of deposition of dissolved RbN3 solution are disclosed in patent application US 20120301631 (A1). On a second borofloat glass wafer of 0.2 mm thickness, discs of 80 μm diameter with 10 nm Ti adhesion layer followed by 50 nm Au are structured by lift-off process. The open cavities in the silicon wafer are then hermetically closed by anodic bonding using the second glass wafer, with the gold discs being exposed to the cavities. The configuration of the gold discs is such that eight gold discs are exposed to each cavity, four discs on the horizontal axis and four discs on the vertical axis. The four external discs are located at a distance of 250 μm from the cavity border, while the four inner discs are located at a distance of 450 μm from the cavity border. The triple wafer stack is then diced into individual vapor cells having the external dimensions of 4×4×1.4 mm3. The diced vapor cells are UV irradiated during 28 hours using a low pressure mercury TUV lamp (Philipps Electronics N.V.) emitting at 254 nm. Decomposition of RbN3 generates visible metallic rubidium under binocular observation.

The alkali vapor cells are thereafter placed on a thermally insulated support and put in an oven at 180° C. for 25 hours. After cooling to room temperature metallic rubidium is present upon each gold disk while no metallic rubidium is deposited elsewhere, as illustrated in FIG. 4.

The invention claimed is:

1. An alkali vapor cell comprising a sealed chamber enclosing an alkali atomic gas therein and having at least one optically transparent window, the chamber and the transparent window defining an optical beam path through which a light beam can pass and interact with the alkali atomic gas in the chamber, wherein said alkali vapor cell comprises at least one localized condensation area of alkali atoms at a predetermined location in the sealed chamber, said at least one localized condensation area comprising a metal layer, wherein the metal of said metal layer is made of copper, tantalum, gold, platinum, nickel, or a combination thereof.

2. Alkali vapor cell according to claim 1, wherein said predetermined location is located outside said optical beam path.

3. Alkali vapor cell according to claim 1, wherein said predetermined location is located inside said optical beam path.

4. Alkali vapor cell according to claim 1, wherein said localized condensation area has higher alkali metal wettability than any other surface portion of the alkali vapor cell outside said localized condensation area.

5. Alkali vapor cell according to claim 1, wherein said chamber comprises a second window.

6. Alkali vapor cell according to claim 1, wherein the localized condensation area is on at least one of the internal surfaces of the chamber.

7. Alkali vapor cell according to claim 1, wherein localized condensation area comprises a ring shaped metal layer disposed on at least one internal surface of the chamber.

8. Alkali vapor cell according to claim 1, comprising several localized condensation areas comprising a plurality of thin metal layers disposed on at least one of the internal surfaces of the chamber.

9. Alkali vapor cell according to claim 1, wherein said localized condensation areas are arranged to form, in operation of said vapor cell, on at least one of said localized condensation areas, a thin film of liquid alkali metal, said thin film having a thickness smaller than 25% of any lateral dimension of said thin film, said lateral dimension being defined in the plane of said thin film perpendicular to said thickness.

10. Atomic clock comprising the alkali vapor cell according to a claim 1.

11. Alkali vapor cell according to claim 1, wherein said localized condensation areas are arranged to form, in operation of said vapor cell, on at least one of said localized condensation areas, a thin film of liquid alkali metal, said thin film having a thickness smaller than 15% of any lateral dimension of said thin film, said lateral dimension being defined in the plane of said thin film perpendicular to said thickness.

12. Magnetometer comprising the alkali vapor cell according to a claim 1.

13. Spectrometric device comprising the alkali vapor cell according to a claim 1.

14. A method to localize condensation of alkali atoms in an alkali vapor cell, comprising the steps of:
forming a chamber of an alkali vapor cell;
providing an alkali metal compound in said chamber;
sealing said chamber with the alkali metal compound therein with a transparent window,
the chamber and window defining an optical beam path through which a light beam can pass,
wherein said method further comprises the step of defining at least one localized condensation area on at least one of the internal surfaces of said chamber in at least one predetermined location prior to filling and sealing said chamber, and wherein the step of defining at least one localized condensation area comprises locally depositing a metal layer on said predetermined location, wherein the metal of said metal layer is made of copper, tantalum, gold, platinum, nickel or a combination thereof.

15. The method according to claim 14, wherein the step of providing the chamber with an alkali metal compound comprises introducing an alkali metal in said chamber.

16. The method according to claim 14, wherein the step of providing the chamber with an alkali metal compound comprises filling the chamber with an alkali metal compound and producing an alkali metal therefrom.

17. The method according to claim 14, characterized in that said predetermined location is located outside said optical beam path.

18. The method according to claim 14, characterized in that said predetermined location is located inside said optical beam path.

19. An alkali vapor cell comprising a sealed chamber enclosing an alkali atomic gas therein and having at least one optically transparent window, the chamber and the transparent window defining an optical beam path through which a light beam can pass and interact with the alkali atomic gas in the chamber, wherein said alkali vapor cell comprises at least one localized condensation area of alkali atoms at a predetermined location in the sealed chamber, said at least one localized condensation area comprising a diamond or diamond-like carbon or a metal layer, wherein the metal of said metal layer is made of copper, tantalum, gold, platinum, nickel, thallium, tin, lead or a combination thereof.

* * * * *